(12) United States Patent
Pattison et al.

(10) Patent No.: US 8,134,373 B1
(45) Date of Patent: Mar. 13, 2012

(54) APPARATUS AND METHOD FOR DETECTING PERFORMANCE VARIATIONS

(75) Inventors: John H. Pattison, Tucson, AZ (US); John Schmitz, Tucson, AZ (US)

(73) Assignee: Ridgetop Group, LLC., Tucson, AZ (US)

( * ) Notice: Subject to any disclaimer, the term of this patent is extended or adjusted under 35 U.S.C. 154(b) by 869 days.

(21) Appl. No.: 12/191,452

(22) Filed: Aug. 14, 2008

Related U.S. Application Data

(60) Provisional application No. 60/964,586, filed on Aug. 14, 2007.

(51) Int. Cl.
*G01R 31/02* (2006.01)
*G01R 27/28* (2006.01)

(52) U.S. Cl. ........................................ 324/537; 324/616

(58) Field of Classification Search .................. 324/521, 324/522, 537, 555, 616
See application file for complete search history.

(56) References Cited

U.S. PATENT DOCUMENTS

2003/0204777 A1* 10/2003 Kojori ............................ 714/14
2008/0272658 A1* 11/2008 Kojori et al. .................. 307/129

* cited by examiner

*Primary Examiner* — Amy He
(74) *Attorney, Agent, or Firm* — Hayes Soloway P.C.

(57) ABSTRACT

The system contains a circuit apparatus and method for monitoring the status of components within a digital system, the apparatus having a digital device. A power-line is supplied to the digital device. A second signal is rendered from the power-line. At least one mask pulse is generated from a third signal. An extraction device is situated to extract a component of the power-line. A filtering device is situated to receive the extracted component. An extracted signal is output by the filtering device, wherein the extracted signal is a correlated result having characteristics corresponding to the status of components in a digital system.

14 Claims, 7 Drawing Sheets

If an e+ signal 40 and e+ mask 41 are mixed, the result is positive:

If an e- signal 42 and e+ mask 41 are mixed, the result is negative:

APPARATUS AND METHOD FOR DETECTING PERFORMANCE VARIATIONS

CROSS-REFERENCE TO RELATED APPLICATIONS

This application claims priority to U.S. Provisional Application entitled, "Power Line I/O Bit Stream Correlation," having Ser. No. 60/964,586, filed Aug. 14, 2007 which is entirely incorporated herein by reference.

This application was made in part with Government support under contract N68335-07-C-0172 awarded by NAVAIR.

FIELD OF THE INVENTION

This invention is generally related to detecting performance variations and is more particularly related to detecting performance variations using power-line input/output signals and bit stream correlations.

BACKGROUND OF THE INVENTION

As a new field, prognostics or predictive diagnostics, is concerned with monitoring and assessing the operational status of electronic devices. The goal, beyond predicting the overall lifecycle of a device, is to determine the cause or causes of the eventual failure as well as the point in time where performance begins decreasing. To accomplish this, electronic prognostics rely on precursor signatures. These signatures indicate changes in operation that become metrics used to determine the "health status" of a digital device. Part of the on-going growth and maturation of the prognostics field involves identifying characteristics of an operating device that are predictive of performance, current health status, and remaining useful life. Once a predictive characteristic has been identified, a method must be developed that accurately and reliably extracts this characteristic for processing into a metric.

The best precursor signatures are those that can be correlated with failure but detected before performance is compromised. These sub-critical variations in performance give the most warning that makes them particularly useful as inputs for a prognostic health management (PHM) analysis platform or application.

At this time, prognostics or predictive diagnostics is a new field and in the process of discovery and maturation. The number of proven and reliable metrics is very limited. Examples of two existing metrics are Remaining Useful Lifetime (RUL) and State of Health (SoH). Prior efforts have involved destructive or invasive methodology to statistically forecast an expected device lifetime rather than monitor devices and gather the real-time data needed to determine actual lifecycles for specific devices in the field.

Thus, a heretofore unaddressed need exists in the industry to address the aforementioned deficiencies and inadequacies.

SUMMARY OF THE INVENTION

Embodiments of the present invention provide an apparatus and method for detecting sub-critical variations in a digital system. Briefly described, in architecture, one embodiment of the system, among others, can be implemented as follows. The system contains a circuit apparatus for monitoring the status of components within a digital system, the apparatus having a digital device. A power-line is supplied to the digital device. A second signal is rendered from the power-line. At least one mask pulse is generated from a third signal. An extraction device is situated to extract a component of the at least one mask pulse. A filtering device is situated to receive the extracted component. An extracted signal is output by the filtering device, wherein the extracted signal is a correlated result having characteristics corresponding to the status of components in a digital system.

The present invention can also be viewed as providing a method of monitoring the status of components within a digital system. In this regard, one embodiment of such a method, among others, can be broadly summarized by the following steps: supplying a digital device with a power-line; rendering a change in the power-line into a second signal; generating at least one mask pulse from a third signal; extracting a component of the power-line; filtering the extracted component to generate an extracted signal; and determining a correlated result from the extracted signal, the correlated result having characteristics corresponding to the status of components in a digital system.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The transition of a digital bit from a high to low state or from low to high will cause a fluctuation in the supply current along a power-line feeding any device that drives that bit onto a signal line. The exact nature of the fluctuation will depend on the characteristics of the bit driver as well as the characteristics of the line loads that are driven by the bit. Thus, time-dependent transfer functions that relate a bit transition to the associated power-line fluctuation can be useful for prognosticating health of devices attached to the power-line. Two specific metrics, gain and phase shift, can be extracted from the transfer functions and utilized to predict health of individual devices and the overall system.

Many digital bit stream sequences appear random unless correlated against an exact replica (or suitable transform) of themselves, in which case they have a large and sharply defined autocorrelation peak. Thus, power-line fluctuations caused by a given bit may be extracted from a noisy power supply line on a device that is driving many ports simultaneously. Similarly, a single representation of a current on the power-line can be correlated against many bit streams simultaneously through parallel architectures.

Figure 1:
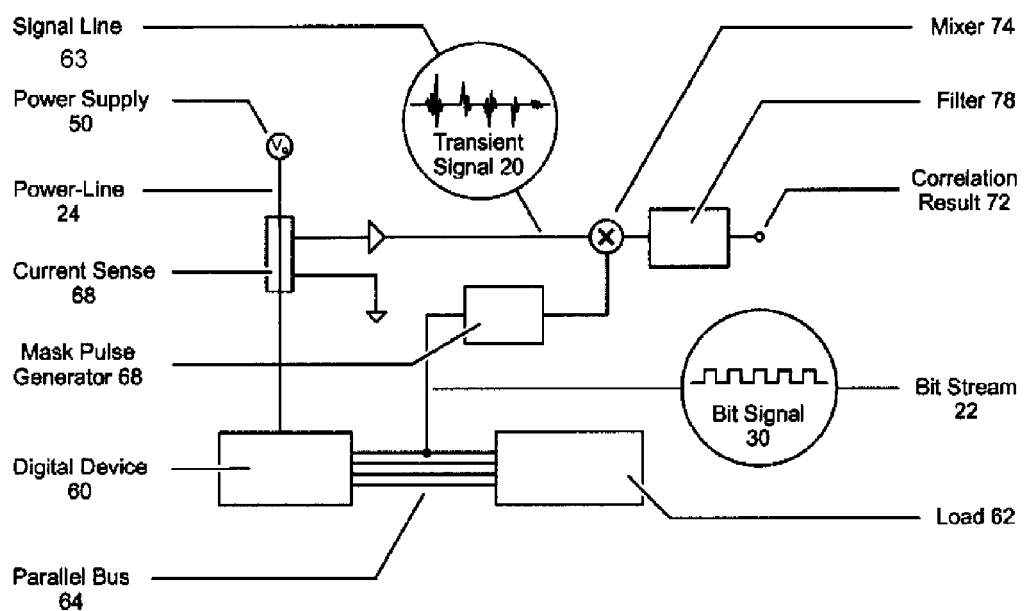
FIG. 1 is an illustration of a system for monitoring current on a power-line, in accordance with the first exemplary embodiment of the present invention.
Figure 10:
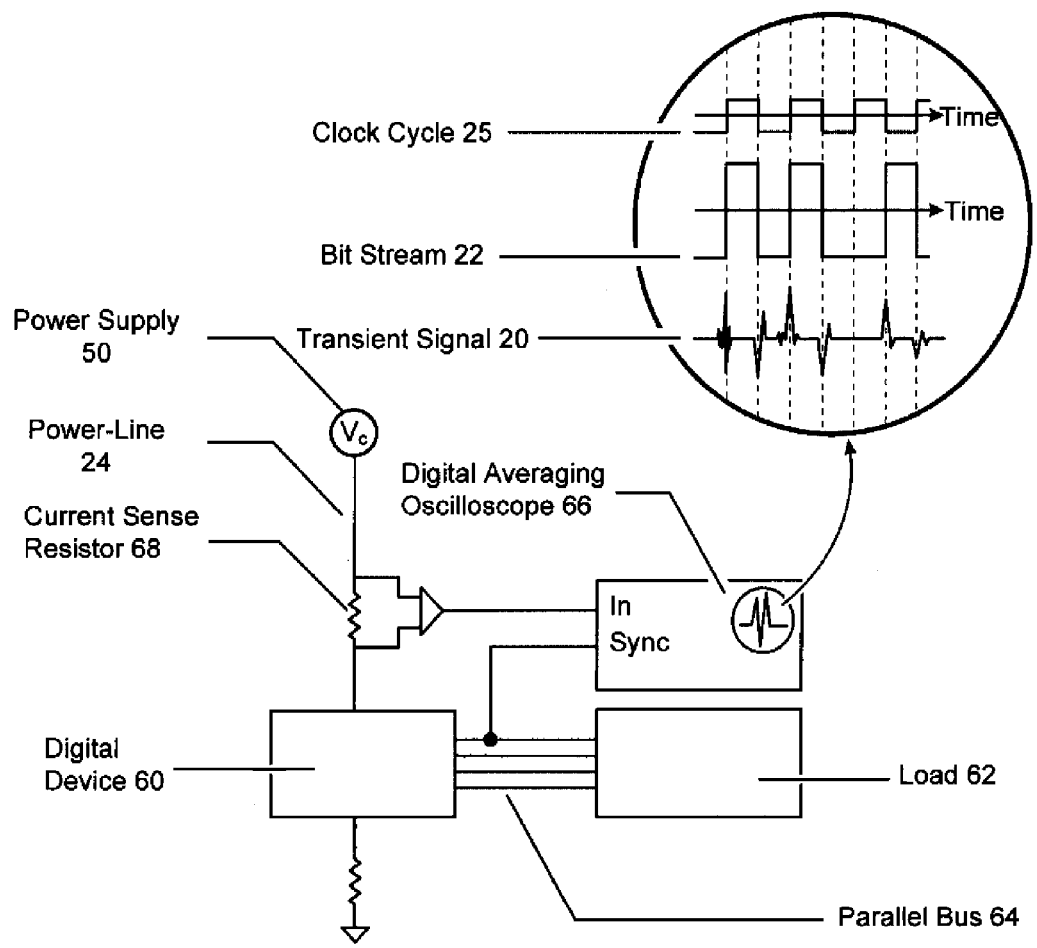
FIG. 10 is an illustration of a circuit for determining optimal shapes of mask functions, in accordance with the first embodiment of the present invention.

FIG. 1 is an illustration of a system for monitoring current on a power-line, in accordance with the first exemplary embodiment of the present invention. FIG. 1 identifies the basic signals of the system: the power-line 24 carrying the transient signal 20, the parallel bus 64 carrying the aggregate bit stream 22 and signal line 63 carrying the bit signal for at least one load. and the correlation result 72 which is the output for the circuit. FIG. 1 also identifies the basic circuit components such as the power supply 50, digital device 60, filter 78, mixer 74, load 62, and mask pulse generator 68. FIG. 10 shows the system for monitoring current on a power-line as a similar circuit including two inputs delivered to an oscilloscope 66: a first input is a transient signal 20 from the power-line 24 and a second input is the bit stream 22 from the load 62. The transient signal 20 is taken from the power-line 24 so the current fluctuations can be correlated to the sampled bit stream 22.

Correlating a signal requires a mask. If a signal is a corrupted digital signal which tracks a given bit stream, the correlation may be performed by a digital multiplication of the signal and the mask signal. If the signal and the mask have an approximate linear relationship, the correlation will give an indication of phase shift. If the signal is digitized with a higher sampling rate than the bit rate and a resolution greater than binary, the correlation will indicate amplitude and distortion of the signal. In each case, the correlation will be insensitive to unrelated bit streams superimposed on the signal, such as by a bus, so the effects of a given signal can be located with selection of a proper mask.

Normally in a digital device 60, such as that shown in the exemplary embodiment of FIG. 1, the signal along the power-line 24 and the signal line 63 do not have a linear relationship. Rather, maximum power draw occurs during the logic transitions of the digital signal 30, when voltage levels pass through the linear ranges of the driver circuits. To exploit this effect, the power-line current may be sampled only during intervals in time approximately following bit transitions and the mask, rather than being the bit pattern itself, can be a pulse synchronized with the bit edges and shaped to match anticipated rising and falling current transitions.

When the digital device 60 drives a significant non-reactive load 62, the power-line 24 current will have a prominent component that is a linear reproduction of the bit stream 22. That is, clock-cycle-wide pulses that are either in-phase or inverted copies of the bit stream 22, as opposed to edge transients. As propagation delays are small compared to clock width, simply multiplying the bit stream 22 against the current waveform along the power-line 24 provides a simple correlation. Thus, a two-pronged approach may include a simple correlation to monitor bus load levels and a more sophisticated edge-transient correlation to monitor delays and switching characteristics.

Returning to FIG. 1, an averaging function within the oscilloscope 66 may be triggered by the rising edge of the signal 30 to average the transient signal 20 from the power-line 24 and the bit stream 22 from the load 62. Averaged over many signal 30 transitions, the oscilloscope 66 should reveal the power-line 24 transient characteristic for the rising edge, creating a mask. The process may be repeated for the falling edge. The two masks may be adjusted to provide positive correlations with the associated transients and negative correlations with complementary transients and minimal correlation with random fluctuations.

Figure 2:
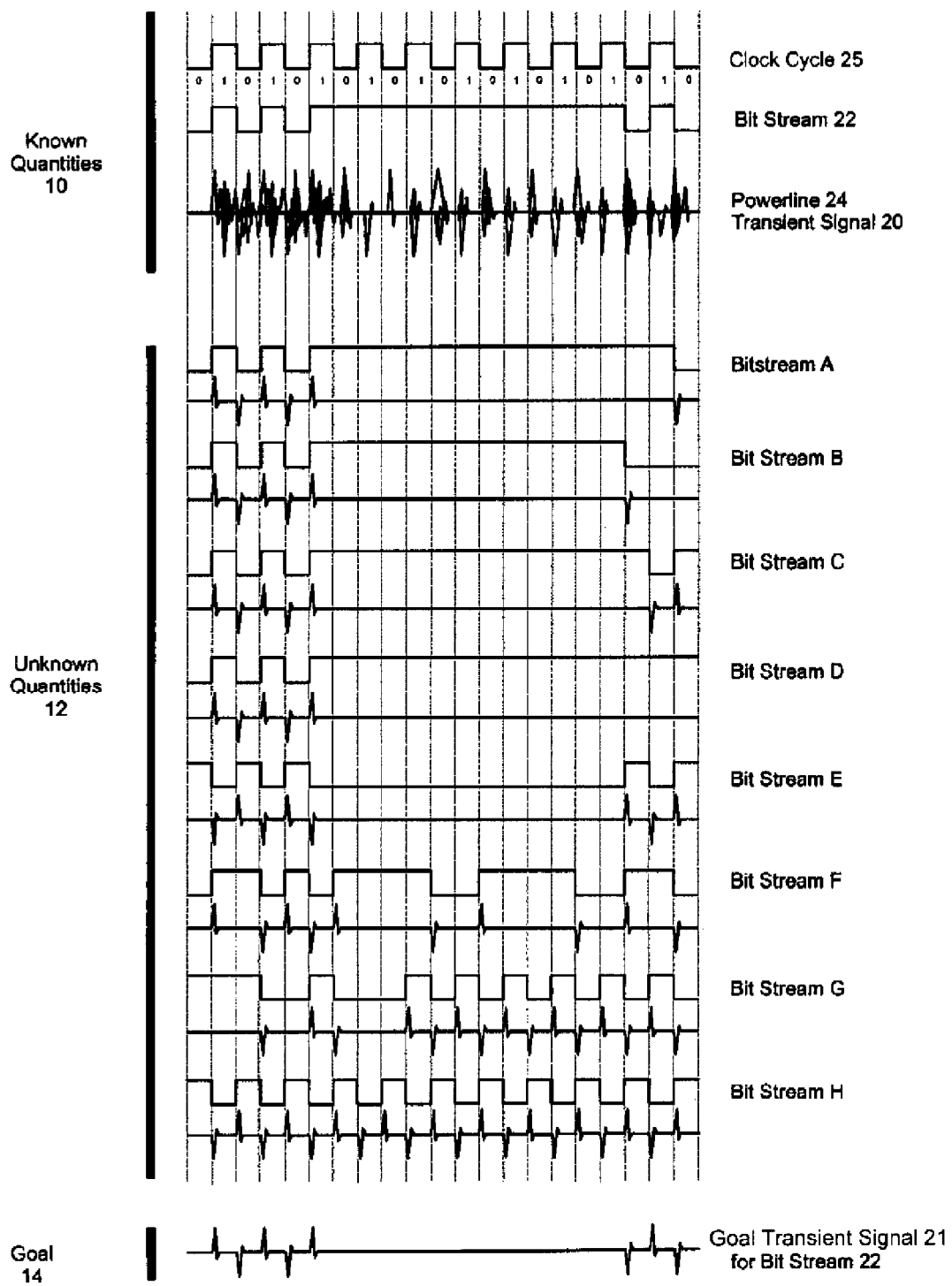
FIG. 2 is an illustrative graph of known and unknown quantities from which a desired result is attained, in accordance with a first exemplary embodiment of the present invention.

FIG. 2 is an illustrative graph of known quantities 10 and unknown quantities 12 from which a desired result is attained, in accordance with a first exemplary embodiment of the present invention. The known quantities section 10 includes a clock cycle 25, a selected bit stream 22, and a power-line transient signal 20. The unknown quantities section 12 includes eight bit streams A-H and eight corresponding transient signals from the other loads fed from the same source as the selected bit stream 22. A goal section 14 includes a goal transient signal 21 specific for the selected bit stream 22. Each of the transient signals of the unknown bit streams A-H combine with the goal transient signal 21 to form the power-line transient signal 20. The goal transition signal 21 needs to be extracted from the power-line transient signal 20.

As FIG. 2 illustrates, extracting the goal transient signal 20 attributable to a bit stream 22 for a specific load of a power-line 24 may be a challenge. Unknown quantities section 12 illustrates a plurality of transient signals that cloud the power-line transient signal thereby giving insight towards the complexity of extracting the goal transient signal 20 from a power-line 24 with the power-line transient signals 20 impacted by the transient signals eight other bit streams A-H.

Figure 3:
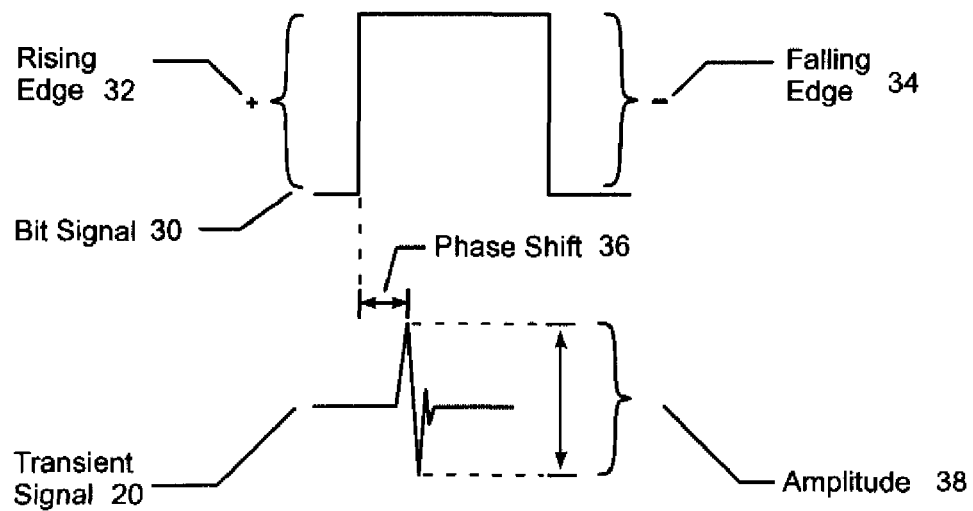
FIG. 3 is an illustration of a digital bit signal and a transient signal, in accordance with the first exemplary embodiment of the present invention.

FIG. 3 is an illustration of a digital bit signal 30 and a transient signal 20, in accordance with the first exemplary embodiment of the present invention. The bit signal 30 has a rising edge 32 and a falling edge 34. The rising edge 32 may be characterized as a positive edge and may indicate the transition of a bit signal 30 from a low state to a high state, or in typically, from a zero value to a one value. The falling edge 34 may be characterized as a negative edge and may indicate the transition of a bit signal 30 from a high state to a low state or from a one value to a zero value.

FIG. 3 also includes a transient signal 20 having a phase shift 36 and amplitude 38. Amplitude 38 is the peak-to-peak value of the transient signal 20 while phase shift 36 is the lag between the rising edge 32 of the bit signal 30 and the transient signal 20. Amplitude 38 and phase shift 36 may be considered metrics targeted for extraction to detecting variations in a digital system. The phase shift 36 and amplitude 38 may also be considered fluctuations in the transient signal 20. These fluctuations may be caused by, in part, a bit signal 30 shift in a supply current. This shift may be caused by the characteristics of input/output (I/O) drivers and loads. In the past, these fluctuations created by bit signal 30 shifts have hindered a reliable prognosis and extraction of a digital system.

The transition of a bit signal 30 from a high-to-low state or from low-to-high state causes a fluctuation in the supply current feeding any device driving that bit signal 30. The exact nature of a fluctuation in the supply current 50 may depend on the characteristics of an I/O bit driver and the load associated with a circuit. I/O bit driver characteristics may commonly be slew rate, internal series resistance and leakage or pull-up/pull-down resistance, and internal capacitance. Line load characteristics may be interconnects, printed circuit board (PCB) traces, and I/O buffer inputs on other devices. The time-dependent transfer function relating an I/O bit transition to the associated driver transient signal 20 may be a good prognostic indicator for the health of a device, a driver and a load attached to a given signal line or bus. The two metrics, amplitude 38 and phase shift 36, may be extracted from that time-dependent transfer function with a correlation operation and thereby may be ideal inputs for a Prognostic Health Management (PHM) system.

As may be seen in FIG. 2, many typical bit stream 22 sequences have a random or Pseudo-Random Noise (PRN) characteristic, only appearing random until correlated against a suitable signal which is a linear replica of themselves. When a PRN bit stream 22 is compared to its mask, the result is a large, sharply defined autocorrelation peak. This may allow transient signals 20 caused by a given I/O bit stream 22 to be extracted from a noisy power-line 24 on a device, which is driving many I/O ports simultaneously. Likewise, a single digitized representation of a supply current on the power-line 24 may be correlated against many I/O bit streams 22 simultaneously through parallel architectures, providing a very high number of prognostic indicator channels per device.

The signal extracted from a noisy power-line may be characterized as a low-frequency signal or a high-frequency signal. This characterization may depend on the frequency of the signal as compared to a baud rate. A low-frequency signal may be a signal with a frequency that is less than a baud rate whereas a high-frequency signal may be a signal with a frequency that is greater than a baud rate. Currently, the baud rate may be found to range from a low of 100 kHz to a high of 2 MHz, however further baud rates may fall within other ranges and are anticipated to do so. The high-frequency signal may be as high as possible, ideally 10 MHz or on the order of the inverse of a slew rate of a bit stream 22. The low-frequency signal may generally be less than the baud rate, currently 100 kHz.

The correlation operation, $$R(t) = \int m(t+t)*[s(t)+\text{noise}]dt$$

is a standard tool for extracting signals from noisy environments. If a mask signal, m(t) is identical to the signal, s(t), or merely has a matching time dependence, then its Fourier components will multiply constructively with the corresponding components of the signal s(t), producing an integral which is maximized when t~0. The magnitude of the integral R(t) indicates the amplitude of s(t), and the value of t which maximizes R indicates the phase shift 36 between the signal and mask. If the integral is carried on over a sufficiently long time interval, the m(t)*noise term may contribute a negligible amount to the integral even if the 'noise' contains signals in the same spectral band as the signal.

If the signal s(t) is a corrupted digital signal which tracks a bit stream 22, such as the current waveform of an I/O device driving the data onto a bus, then the correlation may be performed by a digital multiplication of s(t) with a mask signal m(t). This may be seen as merely the bit stream 22, itself. If s(t) and m(t) have an approximately linear relationship, this correlation will give an indication of phase shift 36. If s(t) is digitized with a sampling rate much higher than the bit rate, and a resolution greater than binary, then the correlation result will also indicate amplitude 38 and distortion of the signal. In both cases the correlation, integrated over a sufficient time interval, will be relatively insensitive to the presence of unrelated bit streams 22 superimposed on the signal s(t), so the effects on a bit signal 30 within a bus can be selected by choice of the mask bit stream 22.

Generally in a digital device, the signal 30 and the supply current 50 (shown in FIG. 10) do not have an exactly linear relationship, but rather, the maximum power draw occurs during the logic transitions when the voltage levels pass through the linear ranges of the driver circuits. Exploiting this effect may result in a much higher sensitivity in the bit stream 22 correlations. To accomplish this, the supply current 50 may be sampled only during the intervals in time just following the bit transitions, and the mask function, rather than simply being the bit pattern itself, can be a pulse synchronized with bit edges and shaped to match the expected current transient signals 20 for rising and falling transitions.

On the other hand, when a significant non-reactive load (such as a termination resistor) is driven by a digital device, the supply current 50 may have a prominent component, which is a simple linear reproduction of the bit stream 22. In other words, the clock-cycle-wide pulses are either in-phase or inverted copies of the bit stream 22 itself, as opposed to edge transient signals 20. In the overall picture of these pulses, propagation delays are small compared to the clock width, and a correlation can be performed by multiplying the bit stream 22 against the current waveform as previously discussed. This may be understood as a two-pronged approach including a correlation to monitor bus load levels, and a more sophisticated edge-transient signal 20 correlation to monitor delays and switching characteristics.

Amplitude 38 is an analog signal and fluctuations in amplitude 38 form a metric useful in digital prognostics. Linear correlation may be used to extract amplitude 38 from the bit stream 22. Since the rising edge 32 and falling edge 34 of bit signals 30 are unique and readily distinguishable from each other, they are ideally suited for characterizing bus load levels. A primary part of extracting the amplitude 38 is to generate masks 41 for the transient signals 20, as discussed below with respect to FIG. 4.

Figure 4:
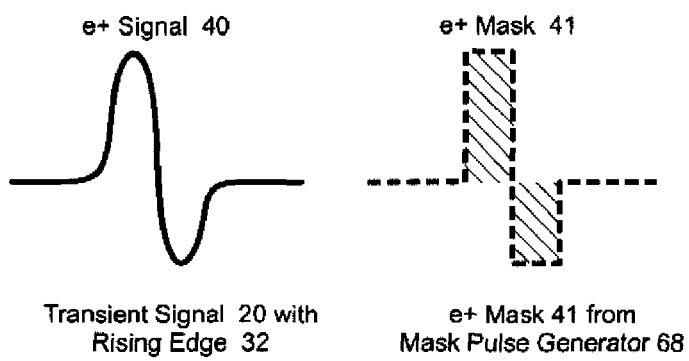
FIG. 4 is an illustration of a positive signal and positive mask as well as a negative signal and negative mask, in accordance with the first exemplary embodiment of the present invention.
Figure 4:
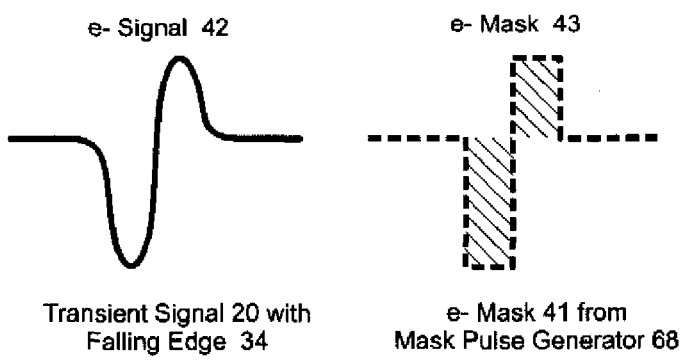

FIG. 4 is an illustration of a positive signal 40 and positive mask 41 as well as a negative signal 42 and a negative mask 43, in accordance with the first exemplary embodiment of the present invention. FIG. 4 illustrates representations of rising edges 32 and falling edges 34, a positive mask 41 and a negative mask 43 generated by a mask pulse generator 33 (shown in FIG. 11). A rising edge 32 may be referred to as e+ and a falling edge 34 may be referred to as e−. The corresponding masks 41, 43 are referred to as e+ mask and e− mask, respectively. In a simple power-line transient correlator, the current power transient signals 20 are multiplied with the masks using a mixer.

Figure 5:
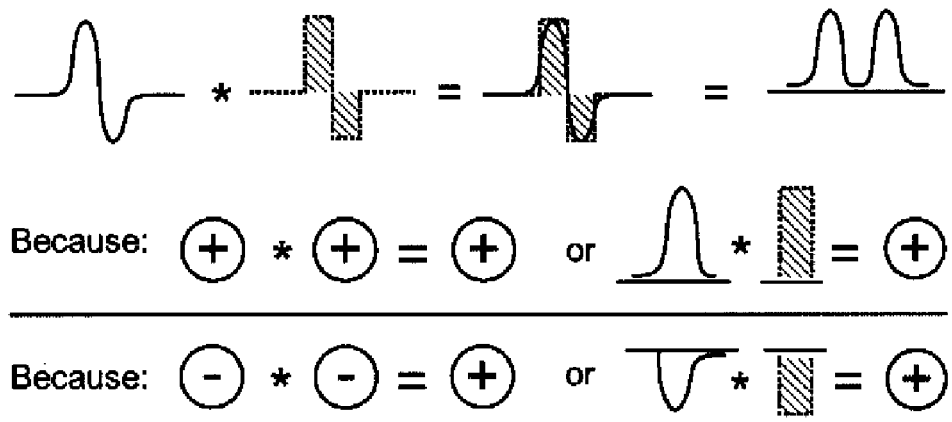
FIG. 5 is an illustration of a simplified mixing operation for a rising edge signal and an e+ mask producing a positive result, in accordance with the first exemplary embodiment of the present invention.
Figure 6:
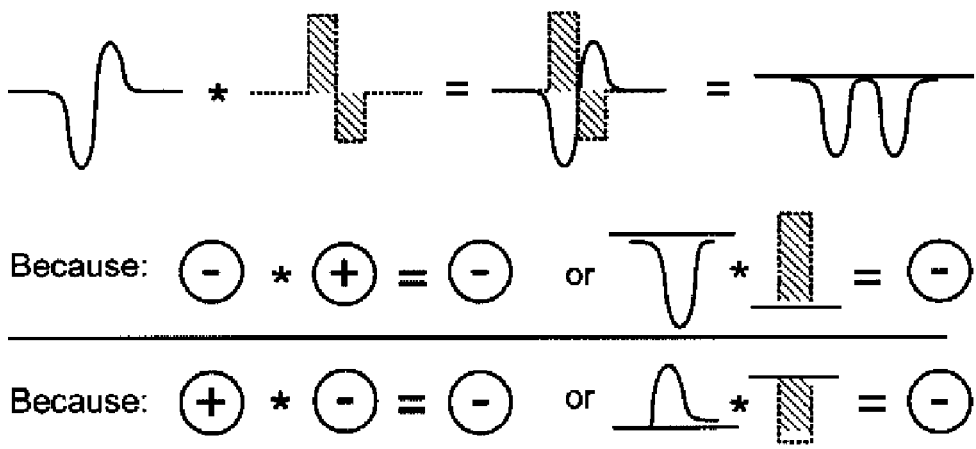
FIG. 6 is an illustration of a simplified mixing operation for a falling edge signal and an e+ mask producing a negative result, in accordance with the first exemplary embodiment of the present invention.

FIG. 5 and FIG. 6 illustrate simplified representations of the mixing operations that combine a transient signal with its mask. FIG. 5 shows a mixing operation involving a rising edge transient 32 and an e+ mask 41. Mixing a rising edge transient 32 and an e+ mask 41 results in a positive result. FIG. 6 shows a mixing operation involving a falling edge transient 34 and an e+ mask 41. Mixing a falling edge transient 34 and an e+ mask 41 results in a negative value. As will be discussed with respect to FIG. 7, additional signal processing may involve the use of a low pass filter 76.

Figure 7:
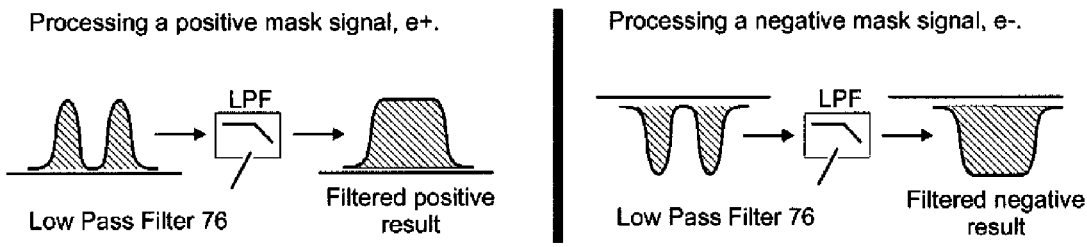
FIG. 7 is an illustration of signal processing of the results of FIG. 5 and FIG. 6 using a low pass filter, in accordance with the first exemplary embodiment of the present invention.
Figure 8:
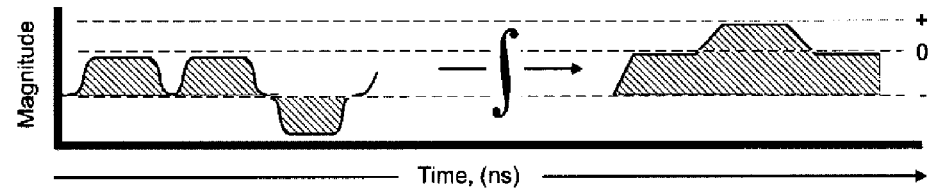
FIG. 8 is an illustration of integration, of the signals processed in FIG. 7, over time that results in an overall positive value, in accordance with the first exemplary embodiment of the present invention.

FIG. 7 is an illustration of signal processing of the results of FIG. 5 and FIG. 6 with a low pass filter 76, in accordance with the first exemplary embodiment of the present invention. FIG. 8 is an illustration of integration, of the signals processed in FIG. 7, over time that results in an overall positive value, in accordance with the first exemplary embodiment of the present invention. As shown in FIG. 8, the processed signal accumulates over time, to produce a correlation result with an overall value that is positive when rising edge transients 32 are predominantly coincident with e+ masks 41 and falling edge transients 34 are predominantly coincident with e− masks 43, negative when those polarities are reversed, and near zero when there is no predominant coincidence.

Figure 9:
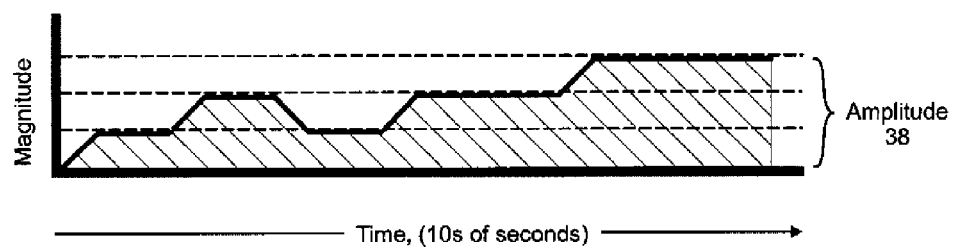
FIG. 9 is an illustration of the changes in magnitude of the correlation result that form the basis for the amplitude metric, in accordance with the first exemplary embodiment of the present invention.

Over a longer period of time, this value will have a larger or smaller magnitude depending upon the behavior of the circuit elements involved in the creation of the power-line transient signals 20. This is the amplitude metric 38 as shown in FIG. 9. Changes in the amplitude 38 are data that can be a vital signature in digital prognostics and therefore useful in monitoring variations in digital systems. Once masks 41 and 43 are generated for each edge 32 or 34, the transient signals 20 and masks 41 and 43 are combined to create different characters of the power-line 24 current. Characters of the power-line 24 current may be used to make predictions in the health or status of a system.

FIG. 10 is an illustration of a circuit for determining optimal shapes of mask functions, in accordance with the first embodiment of the present invention. FIG. 10 includes a digital device 60 connected to a load 62. The connection may be by signal line (FIG. 1) or a parallel bus 64 carrying a plurality of signal bits 30. The load 62 can number from one to multiple. FIG. 10 includes two inputs: a transient signal 20 from the power-line 24 and the bit stream 22 from a load 62. The transient signal 20 is taken from the power-line 24 so the current fluctuations can be correlated to the sampled bit stream 22. Through use of a mask pulse train synthesized from the bit stream 22, phase shift 36 and amplitude 38 are extracted from transients 20 in the supply current 50 for a load 62.

Transient signals 20 may be monitored by a digital oscilloscope 66 across a current sense resistor 68 or similar current sensor in series with the digital device 60, which is programmed to generate a repeating toggle (square wave) on a single bit 30. The oscilloscope 66, with an averaging function, is triggered by the rising edge 32 of a bit signal 30. Averaged over many transitions, the oscilloscope 66 waveform may reveal the power-line transient signal 20 that is characteristic of that edge. This process may be repeated for the falling edge 34 for the same result. The two masks 41 and 43 may be adjusted to provide positive correlations with the associated transients 20, negative correlation with the complementary transients, and ideally, a zero correlation with random fluctuations. This need for symmetry may require the use of current monitors on both the source and drain power-lines of the device 60, since the power-line 24 transient signals 20 will likely involve unbalanced currents.

This technique may be non-invasive and performed actively in real time. The prognostically-enabled devices or systems can be operational and fielded. The metrics may permit ongoing performance evaluation as conditions change and the stresses involved impact the operational envelope. The nature of the design allows for monitoring of individual loads 62 and extraction of prognostic data whether the device 60 or system is connected to any number of I/O loads 62.

Figure 11:
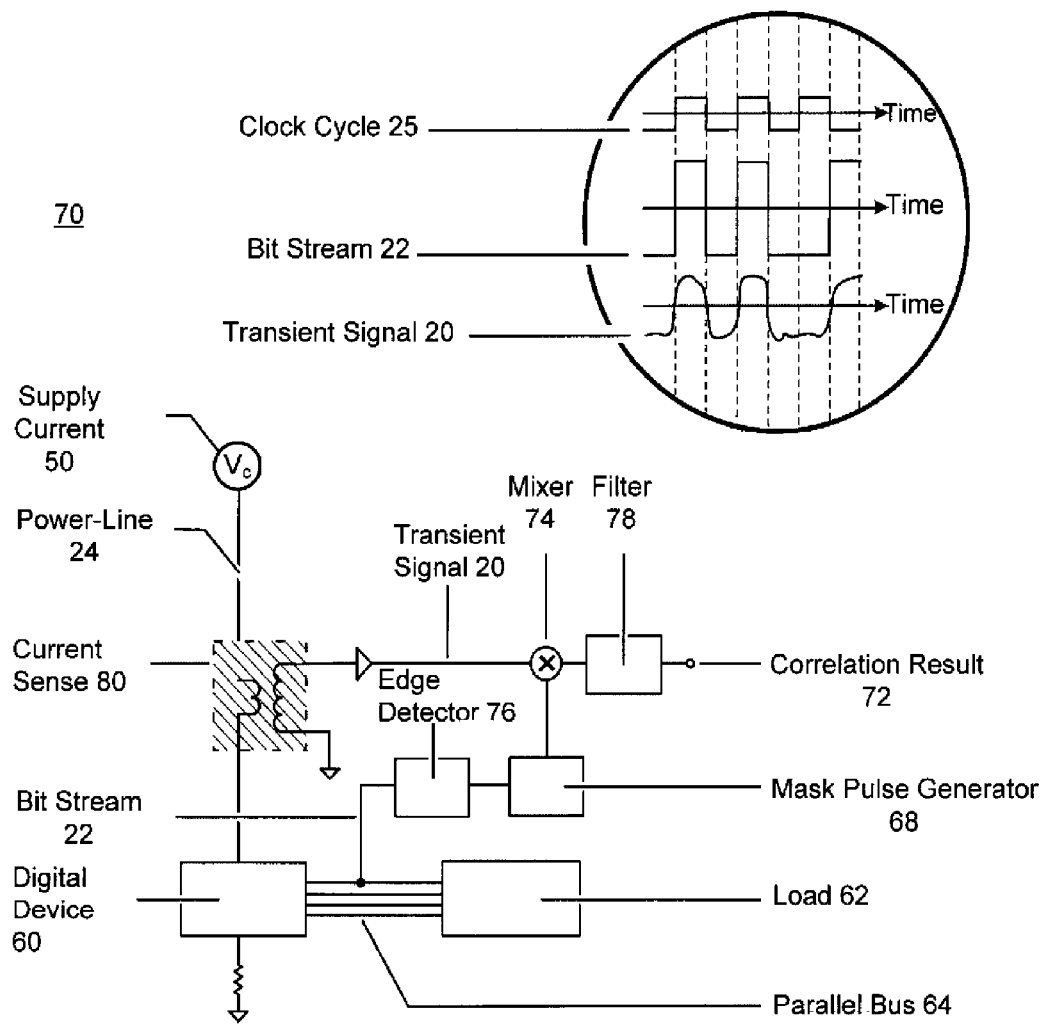
FIG. 11 is an illustration of a circuit to produce a correlation result, in accordance with the first exemplary embodiment of the present invention.

FIG. 11 is an illustration of a circuit situated to produce a correlation result 72, in accordance with the first exemplary embodiment of the present invention. FIG. 11 includes a generalized schematic diagram of a system 70 using optimal masks signals generated upon triggering from associated rising edges 32 or falling edges 34 of selected bits 30. The mask pulses are generated in a mask pulse generator 68 triggered by the rising edge 32 and the falling edge 34 of the bit stream 22 and multiplied by the sensed current transient signal 20 at a mixing stage. The mixing stage may involve the use of a mixer 74, which may be an RF mixer. An edge detector 76 may be used to detect the rising edge 32 or the falling edge 34. A filter 78 may be included adjacent to the mixer 74. The mixer 74 may output a signal to the filter 78 which may be a running correlation that is the correlation result 72. In this figure, the current sensor 80 is a pulse transformer having a high enough RF bandwidth to faithfully transmit the current transients 20, while blocking the DC component. The use of an analog RF mixer 74 may obviate the need to perform an ultra-high-bandwidth digitization of the current transient signals 20; instead, a dedicated direct digital synthesizer might generate the mask pulses. In this embodiment, the mask pulse generator 68 generates both the pulse shapes required for parity. The need for a balanced output may require that a similar correlator be fed from the negative supply conductor.

For parallel correlations of many bit streams 22, the mask pulses may be fanned out to many mixers 74 one per bit 30, and each bit stream 22 would have its own filter/accumulator. Other designs are possible for the present embodiment as well. For example, a single pair of mask pulse generators 68 and mixers 74 could generate rising edge 32 and falling edge 34 correlation terms which would then be gated into analog integrators—one per bit stream 22—according to which transition had occurred in each.

What is claimed is:

1. A method of monitoring the status of components within a digital system, the method comprising:
    supplying a digital device with a current through a power-line;
    rendering a change in the current into a second signal;
    generating at least one mask pulse from a third signal;
    extracting a component of the changed current using the third signal;
    filtering the extracted component to generate a correlated result; and
    determining a status of components in a digital system from the correlated result.

2. The method of claim 1, further comprising the step of detecting a variation in the correlated result.

3. The method of claim 1, wherein the step of rendering a change in the current includes a device that can measure a high frequency current transient.

4. The method of claim 1, wherein the power-line supplies an operating current for the device.

5. The method of claim 1, wherein the step of generating at least one mask pulse from the third signal is triggered by an edge of the third signal.

6. The method of claim 1, wherein the extracted component is a load component caused by an electrical load upon a bit stream.

7. The method of claim 1, wherein the extracted component varies as the device characteristics change.

8. The method of claim 1, wherein the step of rendering a change in the current into a second signal involves an impedance connected to the power-line.

9. The method of claim 1, wherein the step of rendering a change in the current into a second signal involves a Hall effect device connected to the power-line.

10. The method of claim 1, wherein the step of rendering a change in the current into a second signal involves a transformer connected to the power-line.

11. The method of claim 1, wherein the step of extracting a component of the changed current involves a mixer receiving the second signal.

12. The method of claim 1, wherein the step of extracting a component of the changed current involves a multiplier receiving the second signal.

13. The method of claim 1, wherein the step of extracting a component of the changed current involves a demodulator receiving the second signal.

14. A circuit apparatus for monitoring the status of components within a digital system, the apparatus comprising:
 a digital device;
 a power-line connected to the digital device;
 a second signal, rendered from the power-line;
 at least one mask pulse generated from a third signal;
 an extraction device, situated to extract a component of the second signal using the third signal;
 a filtering device, situated to receive the extracted component; and
 a correlated result, output by the filtering device, wherein the correlated result has characteristics corresponding to the status of components in a digital system.

\* \* \* \* \*